US012610800B2

(12) United States Patent
Liu

(10) Patent No.: US 12,610,800 B2
(45) Date of Patent: Apr. 21, 2026

(54) METHOD FOR FORMING SEMICONDUCTOR DEVICE AND SEMICONDUCTOR DEVICE

(71) Applicant: CHANGXIN MEMORY TECHNOLOGIES, INC., Hefei City (CN)

(72) Inventor: Chih-Cheng Liu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 424 days.

(21) Appl. No.: 18/317,066

(22) Filed: May 13, 2023

(65) Prior Publication Data

US 2023/0282517 A1 Sep. 7, 2023

Related U.S. Application Data

(63) Continuation of application No. PCT/CN2022/081991, filed on Mar. 21, 2022.

(30) Foreign Application Priority Data

Jan. 7, 2022 (CN) .......................... 202210013825.1

(51) Int. Cl.
H01L 21/768 (2006.01)
H01L 21/74 (2006.01)
(Continued)

(52) U.S. Cl.
CPC ...... *H01L 21/76898* (2013.01); *H01L 21/743* (2013.01); *H01L 23/481* (2013.01); *H01L 23/535* (2013.01)

(58) Field of Classification Search
CPC ............. H01L 21/76898; H01L 21/743; H01L 23/481; H01L 23/535; H01L 21/76897;
(Continued)

(56) References Cited

U.S. PATENT DOCUMENTS 7,030,012 B2 4/2006 Divakaruni
8,592,988 B2 11/2013 Lee
(Continued)

FOREIGN PATENT DOCUMENTS

CN 1667817 A 9/2005
CN 101140935 A 3/2008
(Continued)

OTHER PUBLICATIONS

International Search Report in the international application No. PCT/CN2022/081991, mailed on Sep. 9, 2022.
(Continued)

*Primary Examiner* — Herve-Louis Y Assouman
(74) *Attorney, Agent, or Firm* — Syncoda LLC; Feng Ma

(57) ABSTRACT

In a method for forming a semiconductor device, a substrate is provided; a word line is formed in the substrate by taking a first face of the substrate as an upper surface; a connecting layer electrically connected to one end of the word line is formed in part of the substrate and on the substrate; a first conducting layer is formed on the connecting layer; and a conducting plug is formed in the substrate by taking a second face of the substrate as an upper surface. The conducting plug is electrically connected to another end of the word line and electrically connected to the first conducting layer via the word line. The first face and the second face are two faces of the substrate opposite to each other in a thickness direction of the substrate.

13 Claims, 9 Drawing Sheets

(51) Int. Cl.
    *H01L 23/48*         (2006.01)
    *H01L 23/535*      (2006.01)
    *H01L 23/538*      (2006.01)
    *H10B 12/00*       (2023.01)

(58) Field of Classification Search
    CPC ............ H01L 23/5384; H01L 23/5386; H10B
                                 12/488; H10B 12/30
    See application file for complete search history.

(56) References Cited

U.S. PATENT DOCUMENTS

| | | |
|---|---|---|
| 2005/0202672 A1 | 9/2005 | Divakaruni |
| 2008/0061340 A1 | 3/2008 | Heineck |
| 2012/0056330 A1 | 3/2012 | Lee |
| 2021/0265260 A1 | 8/2021 | Doornbos et al. |
| 2021/0408115 A1* | 12/2021 | Lin ...................... H10D 84/038 |

FOREIGN PATENT DOCUMENTS

| | | |
|---|---|---|
| CN | 104253082 A | 12/2014 |
| CN | 103367336 B | 8/2016 |
| CN | 111223860 A | 6/2020 |
| CN | 113394185 A | 9/2021 |
| CN | 114068405 A | 2/2022 |
| IN | 113539972 A | 10/2021 |

OTHER PUBLICATIONS

First Office Action of the Chinese application No. 202210013825.1, issued on Feb. 25, 2022.
Second Office Action of the Chinese application No. 202210013825.1, issued on Mar. 24, 2022.
Notice of Allowance of the Chinese application No. 202210013825.1, issued on Apr. 12, 2022.

* cited by examiner

S301

A substrate is provided

S302

A word line is formed in the substrate by taking a first face of the substrate as an upper surface

S303

A connecting layer electrically connected to one end of the word line is formed in part of the substrate and on the substrate

S304

A first conducting layer is formed on the connecting layer

A conducting plug is formed in the substrate by taking a second face of the substrate as an upper surface, in which the conducting plug is electrically connected to the other end of the word line and electrically connected to the first conducting layer via the word line. The first face and the second face are two faces of the substrate opposite to each other in the thickness direction thereof

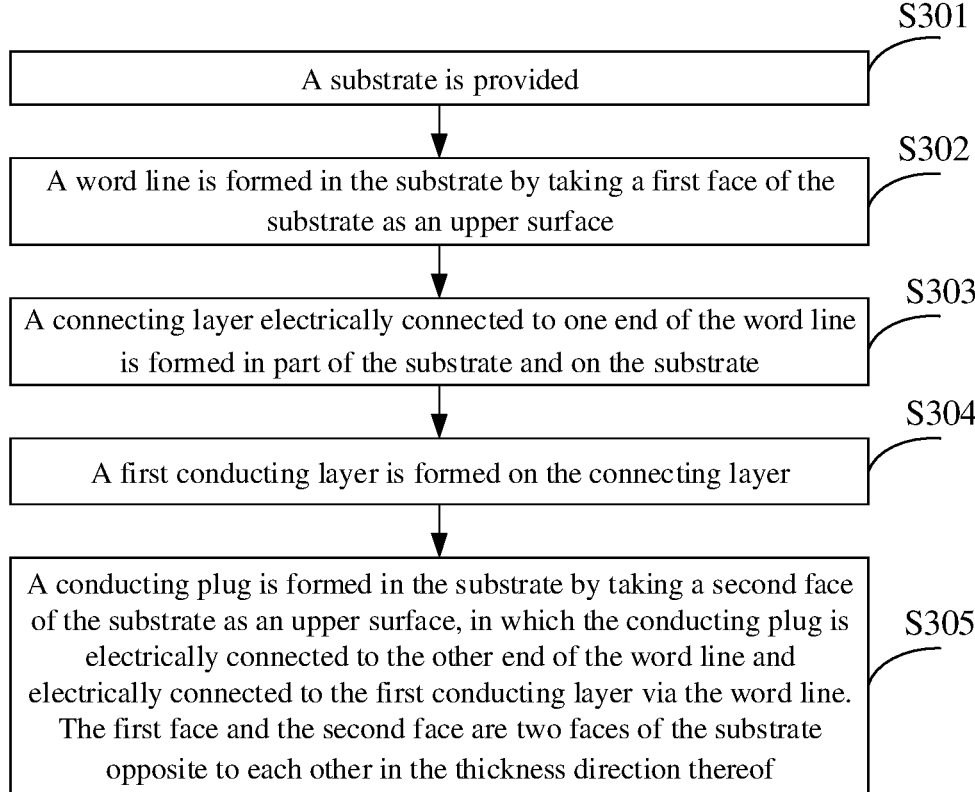

METHOD FOR FORMING SEMICONDUCTOR DEVICE AND SEMICONDUCTOR DEVICE

CROSS-REFERENCE TO RELATED APPLICATIONS

This is a continuation application of International Application No. PCT/CN2022/081991 filed on Mar. 21, 2022, which claims priority to Chinese Patent Application No. 202210013825.1 filed on Jan. 7, 2022. The disclosures of the above-referenced applications are hereby incorporated by reference in their entirety.

BACKGROUND

In the related art, when through silicon via (TSV) technology is used to stack dynamic random access memory (DRAM) chips in a DRAM, TSVs penetrate through the whole substrate and connect to a metal layer.

SUMMARY

Embodiments of the disclosure provide a method for forming a semiconductor device and the semiconductor device.

In a first aspect, embodiments of the disclosure provide a method for forming a semiconductor device. The method includes:

providing a substrate;

forming a word line in the substrate by taking a first face of the substrate as an upper surface;

forming a connecting layer electrically connected to one end of the word line in part of the substrate and on the substrate;

forming a first conducting layer on the connecting layer; and forming a conducting plug in the substrate by taking a second face of the substrate as an upper surface, in which the conducting plug is electrically connected to another end of the word line and electrically connected to the first conducting layer via the word line, and the first face and the second face are two faces of the substrate opposite to each other in a thickness direction of the substrate.

In a second aspect, embodiments of the disclosure provide a semiconductor device, and the semiconductor device includes at least:

a substrate;

a word line located in the substrate, in which the word line is close to a first face of the substrate;

a connecting layer located in part of the substrate and on the substrate and electrically connected to one end of the word line;

a first conducting layer located on the connecting layer; and a conducting plug located in the substrate and electrically connected to another end of the word line, in which the conducting plug is electrically connected to the first conducting layer via the word line, and the conducting plug is close to a second face of the substrate, and wherein the first face and the second face are two faces of the substrate opposite to each other in a thickness direction of the substrate.

BRIEF DESCRIPTION OF THE DRAWINGS

In the drawings (which are not necessarily drawn to scale), similar reference numerals may describe similar parts

Figure 1:
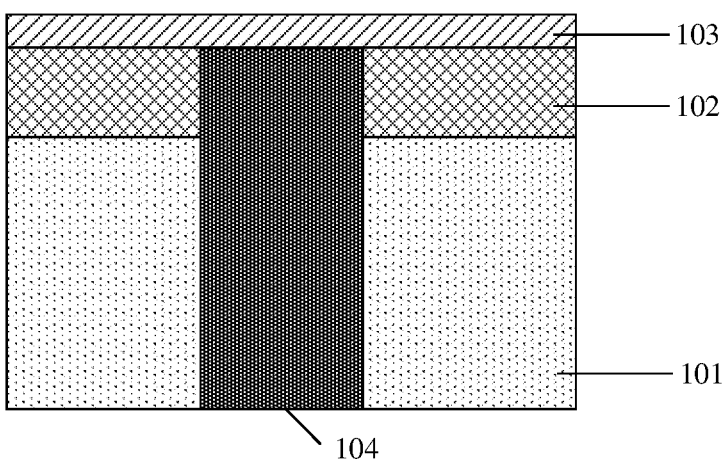

2 in different views. Similar reference numerals with different letter suffixes may represent different examples of similar parts. The various embodiments discussed herein are generally shown in the accompanying drawings by way of example, but not limitation.

Figure 2A:
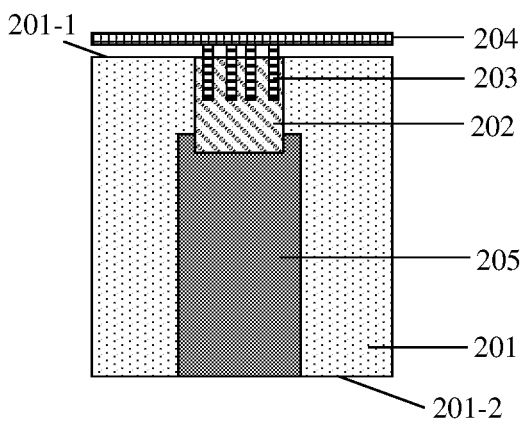
Figure 2B:
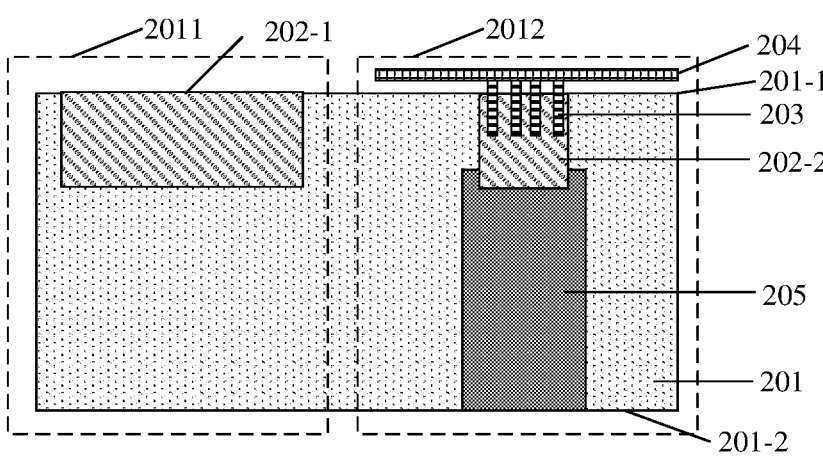
Figure 2C:
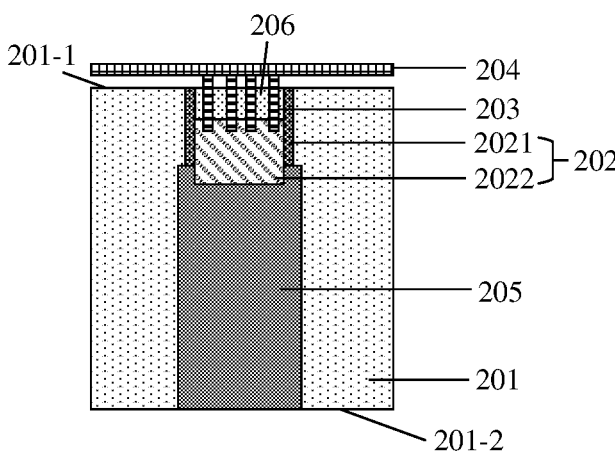
Figure 2D:
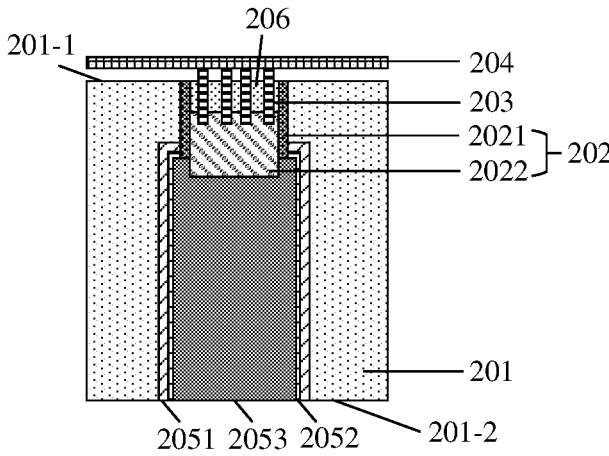
Figure 2E:
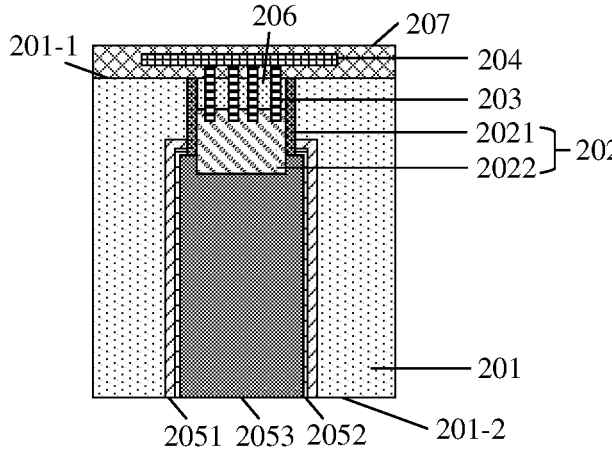
Figure 4B:
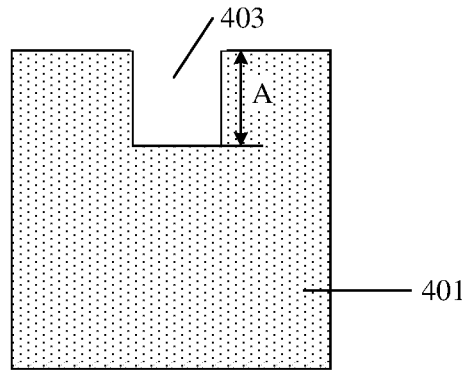
Figure 4C:
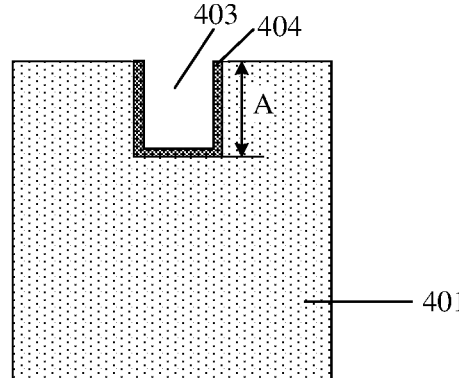
Figure 4D:
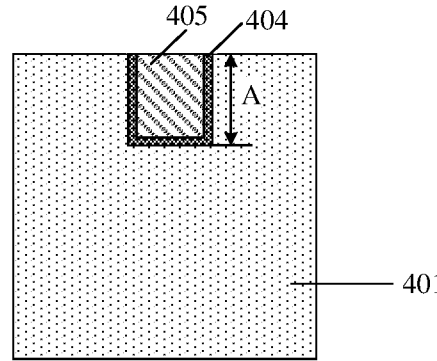
Figure 4E:
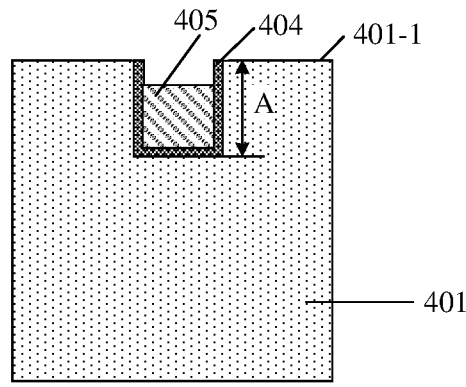
Figure 4F:
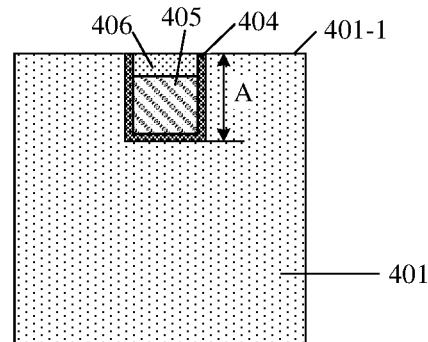
Figure 4G:
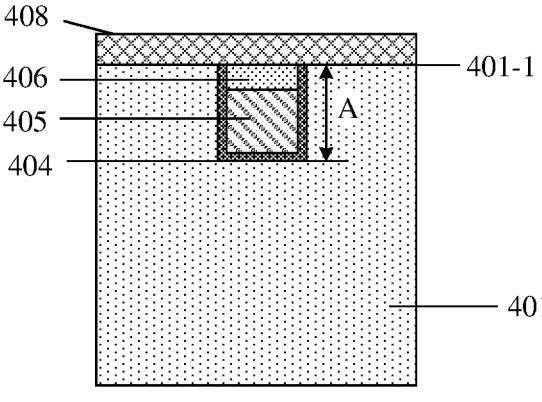
Figure 4H:
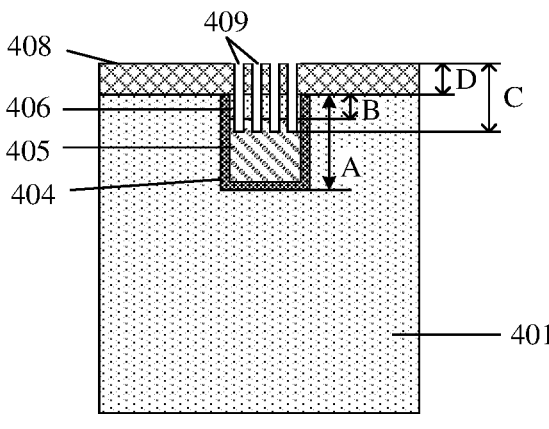
Figure 4I:
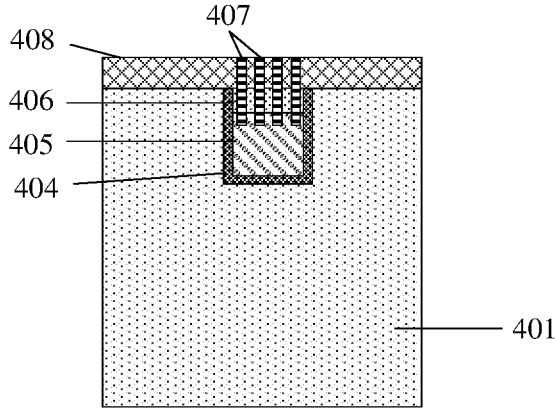
Figure 4J:
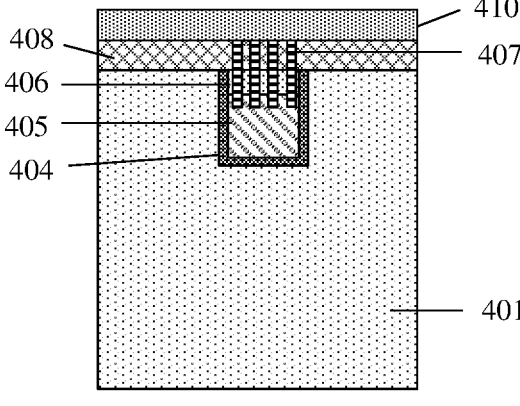
Figure 4K:
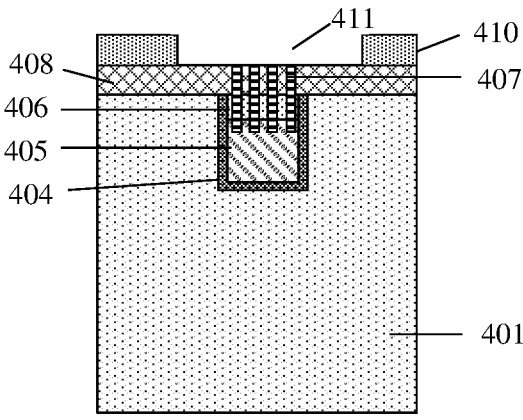
Figure 4L:
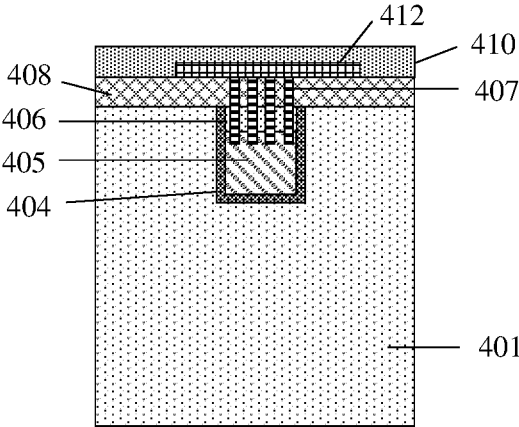
Figure 4M:
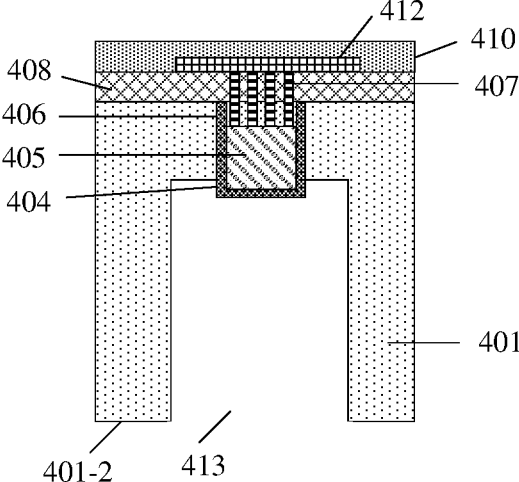
Figure 4N:
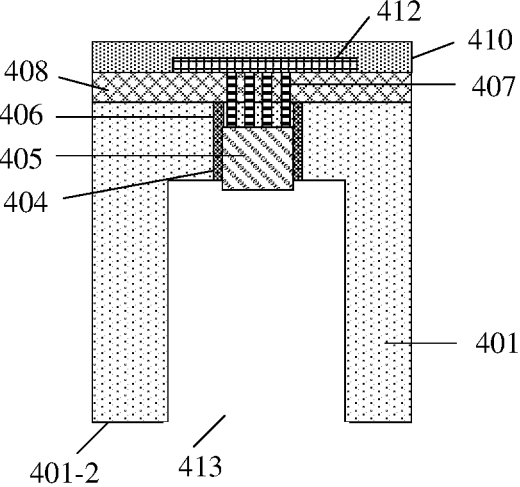
Figure 4O:
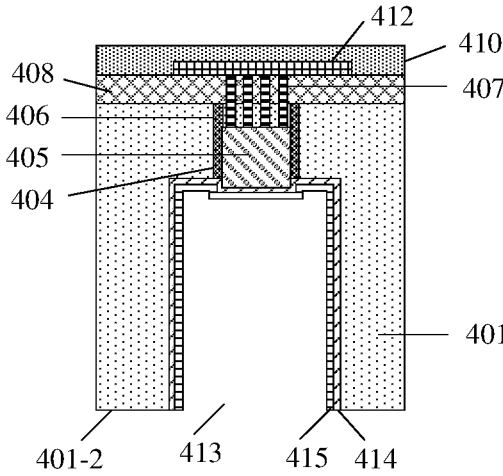
Figure 4P:
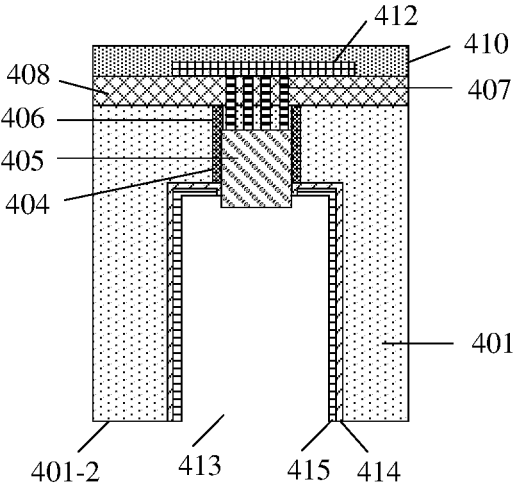
Figure 4Q:
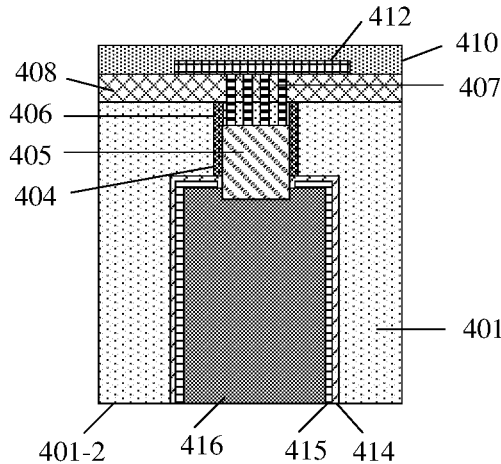

FIG. 1 is a partial structural schematic diagram of a TSV technology in the related art;

FIG. 2A is a first partial structural schematic diagram of the semiconductor device provided by embodiments of the disclosure;

FIG. 2B is a second partial structural schematic diagram of the semiconductor device provided by embodiments of the disclosure;

FIG. 2C is a third partial structural schematic diagram of the semiconductor device provided by embodiments of the disclosure;

FIG. 2D is a fourth partial structural schematic diagram of the semiconductor device provided by embodiments of the disclosure;

FIG. 2E is a fifth partial structural schematic diagram of the semiconductor device provided by embodiments of the disclosure;

FIG. 3 is a flowchart of the method for forming a semiconductor device provided by embodiments of the disclosure;

FIG. 4A is a first partial structural schematic diagram corresponding to a method for forming a semiconductor device provided by embodiments of the disclosure;

FIG. 4B is a second partial structural schematic diagram corresponding to a method for forming a semiconductor device provided by embodiments of the disclosure;

FIG. 4C is a third partial structural schematic diagram corresponding to a method for forming a semiconductor device provided by embodiments of the disclosure;

FIG. 4D is a fourth partial structural schematic diagram corresponding to a method for forming a semiconductor device provided by embodiments of the disclosure;

FIG. 4E is a fifth partial structural schematic diagram corresponding to a method for forming a semiconductor device provided by embodiments of the disclosure;

FIG. 4F is a sixth partial structural schematic diagram corresponding to a method for forming a semiconductor device provided by embodiments of the disclosure;

FIG. 4G is a seventh partial structural schematic diagram corresponding to a method for forming a semiconductor device provided by embodiments of the disclosure;

FIG. 4H is an eighth partial structural schematic diagram corresponding to a method for forming a semiconductor device provided by embodiments of the disclosure;

FIG. 4I is a ninth partial structural schematic diagram corresponding to a method for forming a semiconductor device provided by embodiments of the disclosure;

FIG. 4J is a tenth partial structural schematic diagram corresponding to a method for forming a semiconductor device provided by embodiments of the disclosure;

FIG. 4K is an eleventh partial structural schematic diagram corresponding to a method for forming a semiconductor device provided by embodiments of the disclosure;

FIG. 4L is a twelfth partial structural schematic diagram corresponding to a method for forming a semiconductor device provided by embodiments of the disclosure;

FIG. 4M is a thirteenth partial structural schematic diagram corresponding to a method for forming a semiconductor device provided by embodiments of the disclosure;

FIG. 4N is a fourteenth partial structural schematic diagram corresponding to a method for forming a semiconductor device provided by embodiments of the disclosure;

FIG. 4O is a fifteenth partial structural schematic diagram corresponding to a method for forming a semiconductor device provided by embodiments of the disclosure;

FIG. 4P is a sixteenth partial structural schematic diagram corresponding to a method for forming a semiconductor device provided by embodiments of the disclosure; and FIG. 4Q is a seventeenth partial structural schematic diagram corresponding to a method for forming a semiconductor device provided by embodiments of the disclosure.

DETAILED DESCRIPTION

Specific technical solutions of the disclosure will be further described in detail below with reference to the drawings in embodiments of the disclosure. The following embodiments are used to illustrate the disclosure, but not to limit the scope of the disclosure.

In the following description, suffixes such as "module" or "unit" used to denote elements are used only for the benefit of the description of the disclosure and have no specific meaning in themselves. Therefore, "module" or "unit" can be used in a mixed way.

In the related art, DRAM chips are stacked by a TSV technology for high-speed and broadband applications. FIG. 1 is a partial structural schematic diagram of a TSV technology in the related art. As shown in FIG. 1, a dielectric layer 102 and a metal layer 103 are provided on the surface of a substrate 101, and a through silicon via 104 penetrates through both the substrate 101 and the dielectric layer 102, and is connected to the metal layer 103. In this case, the structure of a semiconductor device may be destroyed when bonding by the TSV, causing failure problems when devices are subsequently interconnected.

Embodiments of the disclosure provide a semiconductor device. FIG. 2A to FIG. 2E are partial structural schematic diagrams of the semiconductor device provided by the embodiments of the disclosure. As shown in FIG. 2A, the semiconductor device includes a substrate 201, a word line 202, a connecting layer 203, a first conducting layer 204 and a conducting plug 205. The word line 202 is located in the substrate 201, and the word line is close to a first face 201-1 of the substrate. The connecting layer 203 is located in part of the substrate 201 and on the substrate 201 and electrically connected to one end of the word line 202. The first conducting layer 204 is located on the connecting layer 203. The conducting plug 205 is located in the substrate 201 and electrically connected to the other end of the word line 202, and the conducting plug 205 is electrically connected to the first conducting layer 204 via the word line 202, and the conducting plug 205 is close to a second face 201-2 of the substrate 201. The first face 201-1 and the second face 201-2 are two faces of the substrate 201 opposite to each other in the thickness direction thereof.

In some embodiments, the substrate 201 includes at least an array region 2011 and a peripheral region 2012. The word line 202 includes a word line 202-1 in the array region 2011 and a word line 202-2 in the peripheral region 2012. The connecting layer 203 is located at the peripheral region 2012 and electrically connected to one end of the word line 202-2 in the peripheral region 2012, as shown in FIG. 2B.

In some embodiments, the word line 202 includes a word line dielectric layer 2021 and a second conducting layer 2022. The word line dielectric layer 2021 is located on the surface of the substrate 201. The second conducting layer 2022 is located on the surface of the word line dielectric layer 2021, and the surface of the second conducting layer 2022 is lower than the first face of the substrate 201. In some embodiments, the semiconductor device further includes an isolation layer 206 located on the second conducting layer 2022, and the surface of the isolation layer 206 is flush with the first face 201-1 of the substrate 201, as shown in FIG. 2C.

In some embodiments, the conducting plug 205 includes a liner 2051, a buffer layer 2052 and a third conducting layer 2053. The liner 2051 is located on the surface of the substrate 201. The buffer layer 2052 is located on the surface of the liner 2051. The third conducting layer 2053 is located on the surface of the buffer layer 2052 and electrically connected to the second conducting layer 2022, as shown in FIG. 2D.

In some embodiments, the semiconductor device further includes a dielectric layer 207. The dielectric layer 207 is located on the word line 202, the isolation layer 206 and the substrate 201. The first conducting layer 204 and part of the connecting layer 203 are located in the dielectric layer 207, as shown in FIG. 2E.

In some embodiments, the dielectric layer 207 may include a first dielectric layer and a second dielectric layer (not shown in the drawings), in which the part of the connecting layer 203 is located in the first dielectric layer, and the first conducting layer 204 is located in the second dielectric layer. Materials of the first dielectric layer and the second dielectric layer are the same or different.

In the semiconductor device provided by the embodiments of the disclosure, the word line is formed by taking the first face of the substrate as an upper surface, and the connecting layer connected to the first conducting layer is formed in the word line. The conducting plug is formed by taking the second face of the substrate as an upper surface, and the conducting plug is electrically connected to the first conducting layer via the word line and the connecting layer. According to the embodiments of the disclosure, an indirect connection between the conducting plug and the first conducting layer is realized via the buried word line in the substrate, so that the conducting plug does not penetrate through the whole semiconductor substrate and does not destroy the structure of the semiconductor substrate, thus improving the yield and performance of semiconductor devices.

Based on the semiconductor device provided by the foregoing embodiments, embodiments of the disclosure provide a method for forming a semiconductor device. Reference may be made to FIG. 3, which is a flowchart of the method for forming a semiconductor device provided by embodiments of the disclosure. The semiconductor device provided by the embodiments of the disclosure can be formed by the following operations.

At S301, a substrate is provided.

At S302, a word line is formed in the substrate by taking a first face of the substrate as an upper surface.

At S303, a connecting layer electrically connected to one end of the word line is formed in part of the substrate and on the substrate.

At S304, a first conducting layer is formed on the connecting layer.

At S305, a conducting plug is formed in the substrate by taking a second face of the substrate as an upper surface, in which the conducting plug is electrically connected to the other end of the word line and electrically connected to the first conducting layer via the word line. The first face and the second face are two faces of the substrate opposite to each other in the thickness direction thereof.

Referring to FIG. 4A to FIG. 4Q, the method for forming a semiconductor device provided by embodiments of the disclosure is described in detail below.

As shown in FIG. 4A to FIG. 4E, S301 and S302 are performed, in which a substrate 401 is provided, and a word line 402 is formed in the substrate 401 by taking a first face 401-1 of the substrate 401 as an upper surface.

In some embodiments, the substrate 401 may be made of a semiconductor material, for example, one or more of silicon, germanium, a silicon-germanium compound or a silicon-carbon compound.

In some embodiments, a substrate 401 includes at least an array region 4011 and a peripheral region 4012. The operation that a word line 402 is formed in the substrate 401 means that the word line 402 is formed in both the array region 4011 and the peripheral region 4012 by taking a first face 401-1 of the substrate 401 as an upper surface, as shown in FIG. 4A.

It should be noted that, in order to accurately demonstrate the method for forming a semiconductor device provided by the embodiments of the disclosure, the peripheral region 4012 of the substrate 401 is taken as an example in the following drawings, to illustrate the method for forming a semiconductor device provided by the embodiments of the disclosure.

In some embodiments, the word line 402 is formed in the peripheral region 4012 by the following operations.

At S3021, a first groove having a first thickness is formed in the peripheral region.

Referring to FIG. 4B, a first groove 403 is formed in the peripheral region 4012 of the substrate by wet etching or dry etching. The first groove 403 has a first thickness A in a direction perpendicular to the surface of the substrate 401.

At S3022, a word line dielectric layer covering a sidewall of the first groove is formed.

In embodiments of the disclosure, as shown in FIG. 4C, a word line dielectric layer 404 covering a sidewall of the first groove 403 may be formed by physical vapor deposition (PVD), chemical vapor deposition (CVD), or atomic layer deposition (ALD). The material of the word line dielectric layer 404 may include at least one of silicon carbide (SiC), hafnium oxide (HfO$_2$), hafnium oxide nitride (HfON), aluminium oxide (Al$_2$O$_3$), zirconia (ZrO$_2$), or silicon dioxide (SiO$_2$) or other inorganic oxides.

At S3023, a second conducting layer is filled in the first groove having the word line dielectric layer.

At S3024, the second conducting layer is etched back to form the second conducting layer, the surface of which is lower than the first face of the substrate, to obtain the word line.

Referring to FIG. 4D and FIG. 4E, a second conducting layer 405 may be filled in the first groove 403 having the word line dielectric layer 404 by physical vapor deposition, chemical vapor deposition or atomic layer deposition. After the second conducting layer 405 is formed, the second conducting layer 405 is etched back by wet etching or dry etching to form the second conducting layer 405, the surface of which is lower than the first face 401-1 of the substrate 401. The second conducting layer 405 having the surface lower than the first face 401-1 and the word line dielectric layer 404 constitute the word line 402.

In some embodiments, the second conducting layer 405 of the word line 402 may include at least one of titanium nitride (TiN), tantalum nitride (TaN), hafnium nitride (HfN), aluminum tantalum nitride (TaAlN) or aluminum titanium nitride (TiAlN), tungsten, polysilicon, or other materials.

In some embodiments, after the second conducting layer 405 having the surface lower than the first face 401-1 is formed, the method for forming a semiconductor device provided by the embodiments of the disclosure further includes forming an isolation layer 406 on the second conducting layer 405. The surface of the isolation layer 406 is flush with the first face 401-1 of the substrate 401.

As shown in FIG. 4F, the isolation layer 406 may be formed in a remaining first groove 403 by physical vapor deposition, chemical vapor deposition or atomic layer deposition. The isolation layer 406 may be made of silicon nitride (SiN) or other materials.

In the embodiments of the disclosure, an indirect connection between the conducting plug and the first conducting layer is realized by forming the buried word line in the substrate, and the problem of interconnection failure caused by the conducting plug penetrating through the whole substrate is avoided.

Referring to FIG. 4G to FIG. 4I, S303 is performed, in which a connecting layer 407 electrically connected to one end of the word line 402 is formed in part of the substrate 401 and on the substrate 401.

In some embodiments, the second conducting layer 405 etched back and the word line dielectric layer 404 constitute the word line 402, and the connecting layer 407 is electrically connected to one end of the second conducting layer 405 of the word line 402, that is, the connecting layer 407 is electrically connected to the word line 402.

In some embodiments, the connecting layer may be formed by the following operations.

At S3031, a first dielectric layer is formed on the isolation layer, the word line dielectric layer and the substrate.

Referring to FIG. 4G, a first dielectric layer 408 covering the isolation layer 406, the word line dielectric layer 404 and the substrate 401 is formed by physical vapor deposition, chemical vapor deposition or atomic layer deposition.

In some embodiments, the material of the first dielectric layer 408 may include at least one of zirconia (ZrO$_2$), hafnium oxide (HfO$_2$), titanium zirconium oxide (TiZrO$_4$), ruthenium oxide (RuO$_4$), antimony oxide (Sb$_2$O$_3$ or Sb$_2$O$_5$), aluminium oxide (Al$_2$O$_3$) or other materials.

At S3032, a second groove penetrating through the first dielectric layer and the isolation layer and penetrating through part of the word line in its thickness direction is formed in the first dielectric layer, the isolation layer and the word line, in which the thickness of the second groove is greater than the sum of the second thickness and the thickness of the first dielectric layer.

In some embodiments, the distance between the surface of the word line 402 and the first face 401-1 of the substrate 401 in a direction perpendicular to the substrate 401 is a second thickness B.

In some embodiments, before forming a second groove 409, a photoresist layer (not shown in the drawings) having a preset pattern may be formed on the surface of the first dielectric layer 408. The isolation layer 406, the word line 402 and the first dielectric layer 408 are etched based on the photoresist layer having the preset pattern by wet etching or dry etching, to form the second groove 409 penetrating through the isolation layer 406 and the first dielectric layer 408 and penetrating through part of the word line 402 in its thickness direction.

In some embodiments, the distance between the surface of the word line 402 and the first face 401-1 of the substrate 401 is the second thickness B, the thickness of the second groove 409 is represented by C, and the thickness of the first dielectric layer 408 is represented by D. In the embodiments of the disclosure, the thickness C of the second groove 409 is greater than the sum of the second thickness B and the thickness D of the first dielectric layer 408. In the embodiments of the disclosure, as shown in FIG. 4H, the sum of the first thickness A of the first groove 403 and the thickness D of the first dielectric layer 408 is greater than the thickness C of the second groove 409.

In the embodiments of the disclosure, the number of the second grooves 409 is not limited.

At S3033, the second groove is filled to form the connecting layer electrically connected to one end of the word line.

Referring to FIG. 4I, a connecting layer 407 may be formed in the second groove 409 by physical vapor deposition, chemical vapor deposition or atomic layer deposition.

In the embodiments of the disclosure, one end of the connecting layer 407 is located inside the word line 402, and the connecting layer 407 is connected to the word line 402.

In some embodiments, the material of the connecting layer 407 may include at least one of titanium nitride (TiN), tantalum nitride (TaN), hafnium nitride (HfN), aluminum tantalum nitride (TaAlN), aluminum titanium nitride (TiAlN) or other materials.

In the embodiments of the disclosure, after the connecting layer is formed, the conducting plug is electrically connected to the first conducting layer via the word line and the connecting layer, thus realizing the indirect connection between the conducting plug and the first conducting layer and improving the performance of the semiconductor device.

Referring to FIG. 4J to FIG. 4L, S304 is performed, in which a first conducting layer 412 is formed on the connecting layer 407. In embodiments of the disclosure, the first conducting layer 412 may be formed by the following operations.

At S3041, a second dielectric layer is formed on the surface of the first dielectric layer having the connecting layer.

At S3042, a fourth groove penetrating through the second dielectric layer is formed, in which the fourth groove exposes the connecting layer.

At S3043, the fourth groove is filled to form the first conducting layer, in which the first conducting layer is electrically connected to the connecting layer.

Referring to FIG. 4J, a second dielectric layer 410 may be formed on the surface of the first dielectric layer 408 having the connecting layer 407 by physical vapor deposition, chemical vapor deposition or atomic layer deposition.

In some embodiments, the materials of the first dielectric layer 408 and the second dielectric layer 410 may be the same or different. For example, the material of the second dielectric layer 410 may also include at least one of zirconia ($ZrO_2$), hafnium oxide ($HfO_2$), titanium zirconium oxide ($TiZrO_4$), ruthenium oxide ($RuO_4$), antimony oxide ($Sb_2O_3$ or $Sb_2O_5$), aluminium oxide ($Al_2O_3$) or other materials.

In some embodiments, after the second dielectric layer 410 is formed, a fourth groove 411 is formed in the second dielectric layer 410 by wet etching or dry etching.

In some embodiments, before forming the fourth groove 411, a photoresist layer (not shown in the drawings) having a preset pattern may be formed on the surface of the second dielectric layer 410, and then the second dielectric layer 410 is etched based on the photoresist layer with the preset pattern by wet etching or dry etching to form the fourth groove 411. As shown in FIG. 4K, the fourth groove 411 penetrates through the second dielectric layer 410 to expose the connecting layer 407.

In the embodiments of the disclosure, after the fourth groove 411 is formed, the fourth groove 411 is filled to form a first conducting layer 412. The material of the first conducting layer 412 may include at least one of titanium nitride (TiN), tantalum nitride (TaN), hafnium nitride (HfN), aluminum tantalum nitride (TaAlN), aluminum titanium nitride (TiAlN) or other materials.

In the embodiments of the disclosure, the surface of the first conducting layer 412 may be lower than the surface of the second dielectric layer 410, and after the first conducting layer 412 is formed, the remaining fourth groove 411 is filled, as shown in FIG. 4L. The filling material may be the same as or different from the material of the second dielectric layer 410.

In some embodiments, while the first conducting layer 412 is formed on the surface of the connecting layer 407, a first conducting layer (the first conducting layer in the array region, not shown in the drawings) is formed in the array region (not shown in the drawings) of the substrate 401. The first conducting layer in the array region is electrically connected to a source or a drain in the array region.

Referring to FIG. 4M and FIG. 4N, S305 is performed, in which a conducting plug is formed in the substrate 401 by taking a second face 401-2 of the substrate 401 as an upper surface. The conducting plug is electrically connected to the other end of the word line 402 and is electrically connected to the first conducting layer 412 via the word line 402.

In some embodiments, the first face 401-1 and the second face 401-2 of the substrate 401 are two faces of the substrate opposite to each other in the thickness direction thereof.

In some embodiments, the conducting plug can be formed by the following operations.

At S3051, a third groove is formed in the substrate by taking the second face of the substrate as the upper surface, in which part of the word line dielectric layer is exposed by the third groove.

Referring to FIG. 4M, the substrate 401 is etched by wet etching or dry etching by taking the second face 401-2 of the substrate 401 as the upper surface to form a third groove 413 until part of the word line dielectric layer 404 is exposed by the third groove 413.

At S3052, the part of the word line dielectric layer exposed in the third groove is removed to expose the second conducting layer.

In some embodiments, after the third groove 413 is formed, the word line dielectric layer 404 exposed in the third groove 413 is removed until the second conducting layer 405 is exposed, as shown in FIG. 4N.

At S3053, the third groove exposing the second conducting layer is filled to form the conducting plug electrically connected to the other end of the second conducting layer.

In some embodiments, the conducting plug can be formed in the third groove 413 by the following operations.

At S1, a liner and a buffer layer covering sequentially the surface of the third groove are formed.

At S2, part of the liner and part of the buffer layer covering the second conducting layer are removed to expose the second conducting layer.

At S3, a third conducting layer covering the buffer layer and the exposed second conducting layer is formed, in which the third conducting layer fills up the third groove.

Referring to FIG. 4O to FIG. 4Q, a liner 414 and a buffer layer 415 covering sequentially the surface of the third groove 413 may be formed by physical vapor deposition, chemical vapor deposition or atomic layer deposition. Then, part of the liner 414 and part the buffer layer 415 covering the second conducting layer 405 are removed to expose the second conducting layer 405. Then, a third conducting layer 416 covering the buffer layer 415 and the exposed second conducting layer 405 is formed by physical vapor deposition, chemical vapor deposition or atomic layer deposition. The third conducting layer 416 fills up the remaining third groove 413.

In some embodiments, the liner 414, the buffer layer 415 and the third conducting layer 416 together constitute a conducting plug.

In some embodiments, the materials of the third conducting layer 416 and the second conducting layer 405 may be the same or different. The material of the third conducting layer 416 may include at least one of copper (Cu), titanium nitride (TiN), tantalum nitride (TaN), hafnium nitride (HfN), aluminum tantalum nitride (TaAlN), aluminum titanium nitride (TiAlN), or other materials.

According to the embodiments of the disclosure, the word line is formed by taking the first face of the substrate as an upper surface, the connecting layer connected to the first conducting layer is formed in the word line, the conducting plug is formed by taking the second face of the substrate as an upper surface, and the conducting plug is electrically connected to the first conducting layer via the word line and the connecting layer. In this way, according to the embodiments of the disclosure, an indirect connection between the conducting plug and the first conducting layer is realized via the buried word line in the substrate, so that the conducting plug does not penetrate through the whole semiconductor substrate and does not destroy the structure of the semiconductor substrate, thus improving the yield and performance of semiconductor devices.

In the several embodiments provided by the disclosure, it should be understood that the disclosed device and method may be implemented in a non-target way. The above-described device embodiments are only illustrative. For example, the division of the units is only a logical function division, and there may be other division modes in actual implementation, such as, multiple units or components may be combined or integrated into another system, or some features may be ignored or not be executed. In addition, the components shown or discussed are coupled, or directly coupled to each other.

The units described above as separate components may or may not be physically separate. The components shown as units may or may not be physical units. That is, they may be located in one place or distributed to multiple network units. Some or all of the units may be selected according to actual requirements to achieve the purposes of the solutions of the embodiments of the disclosure.

The above are only some embodiments of the disclosure, but the protection scope of the disclosure is not limited to this. Changes or replacements can be easily thought of by any person skilled in the art and such changes or replacements should be covered by the protection scope of the disclosure. Therefore, the protection scope of the disclosure should be subject to the protection scope of the claims.

In the method for forming a semiconductor device and the semiconductor device provided by embodiments of the disclosure, a word line is formed by taking a first face of a substrate as an upper surface, a connecting layer connected to a first conducting layer is formed in the word line, a conducting plug is formed by taking a second face of the substrate as an upper surface, and the conducting plug is electrically connected to the first conducting layer via the word line and the connecting layer. In this way, according to the embodiments of the disclosure, an indirect connection between the conducting plug and the first conducting layer is realized via the buried word line in the substrate, so that the conducting plug does not penetrate through the whole semiconductor substrate and does not destroy the structure of the semiconductor substrate, thus improving the yield and performance of semiconductor devices.

What is claimed is:

1. A method for forming a semiconductor device, comprising:

providing a substrate;

forming a word line in the substrate by taking a first face of the substrate as an upper surface;

forming a connecting layer electrically connected to one end of the word line in part of the substrate and on the substrate;

forming a first conducting layer on the connecting layer; and forming a conducting plug in the substrate by taking a second face of the substrate as an upper surface, wherein the conducting plug is electrically connected to another end of the word line and electrically connected to the first conducting layer via the word line and the connecting layer, and wherein the first face and the second face are two faces of the substrate opposite to each other in a thickness direction of the substrate;

wherein the substrate comprises at least an array region and a peripheral region;

wherein forming the word line in the substrate comprises:

forming the word line in both the array region and the peripheral region by taking the first face of the substrate as the upper surface; and wherein forming the connecting layer electrically connected to one end of the word line in the part of the substrate and on the substrate comprises:

forming the connecting layer electrically connected to one end of the word line in the peripheral region;

wherein the word line is formed in the peripheral region by the following operations;

forming a first groove having a first thickness in the peripheral region;

forming a word line dielectric layer covering a sidewall of the first groove;

filling a second conducting layer in the first groove having the word line dielectric layer; and etching back the second conducting layer to form the second conducting layer, a surface of which is lower than the first face of the substrate, to obtain the word line.

2. The method according to claim 1, wherein the method further comprises:

forming an isolation layer on the word line, wherein a surface of the isolation layer is flush with the first face of the substrate.

3. The method according to claim 1, wherein forming the connecting layer electrically connected to one end of the word line in the peripheral region comprises:

forming the connecting layer electrically connected to the second conducting layer in the peripheral region.

4. The method according to claim 2, wherein a distance between a surface of the word line and the first face of the substrate is a second thickness; and wherein forming the connecting layer electrically connected to one end of the word line in the peripheral region comprises:

forming a first dielectric layer on the isolation layer, the word line dielectric layer and the substrate;

forming a second groove penetrating through the first dielectric layer and the isolation layer and penetrating through part of the word line in its thickness direction, in the first dielectric layer, the isolation layer and the word line, wherein a thickness of the second groove is greater than a sum of the second thickness and a thickness of the first dielectric layer; and filling the second groove to form the connecting layer electrically connected to one end of the word line.

5. The method according to claim 1, wherein forming the conducting plug in the substrate comprises:

forming a third groove in the substrate by taking the second face of the substrate as the upper surface, wherein part of the word line dielectric layer is exposed by the third groove;

removing the part of the word line dielectric layer exposed in the third groove to expose the second conducting layer; and filling the third groove exposing the second conducting layer to form the conducting plug electrically connected to another end of the second conducting layer.

6. The method according to claim 5, wherein forming the conducting plug electrically connected to the other end of the second conducting layer comprises:

forming a liner and a buffer layer covering sequentially a surface of the third groove;

removing part of the liner and part of the buffer layer covering the second conducting layer to expose the second conducting layer; and forming a third conducting layer covering the buffer layer and the exposed second conducting layer, wherein the third conducting layer fills up the third groove.

7. The method according to claim 1, wherein forming the first conducting layer on a surface of the connecting layer comprises:

forming a second dielectric layer on a surface of the first dielectric layer having the connecting layer;

forming a fourth groove penetrating through the second dielectric layer, wherein the fourth groove exposes the connecting layer;

filling the fourth groove to form the first conducting layer, wherein the first conducting layer is electrically connected to the connecting layer.

8. The method according to claim 1, wherein when forming the first conducting layer on a surface of the connecting layer, the method further comprises:

forming the first conducting layer in the array region, wherein the first conducting layer in the array region is electrically connected to a source or a drain in the array region.

9. A semiconductor device, comprising:

a substrate;

a word line located in the substrate, wherein the word line is close to a first face of the substrate;

a connecting layer located in part of the substrate and on the substrate and electrically connected to one end of the word line;

a first conducting layer located on the connecting layer;

a conducting plug located in the substrate and electrically connected to another end of the word line, wherein the conducting plug is electrically connected to the first conducting layer via the word line and the connecting layer, and the conducting plug is close to a second face of the substrate, and wherein the first face and the second face are two faces of the substrate opposite to each other in a thickness direction of the substrate;

wherein the substrate comprises at least an array region and a peripheral region:

the word line comprises the word line in the array region and the word line in the peripheral region, the connecting layer is located at the peripheral region, and the connecting layer is electrically connected to one end of the word line in the peripheral region;

wherein the word line comprises:

a word line dielectric layer located on a surface of the substrate; and a second conducting layer located on a surface of the word line dielectric layer, wherein a surface of the second conducting layer is lower than the first face of the substrate.

10. The semiconductor device according to claim 9, further comprising:

an isolation layer located on the second conducting layer, wherein a surface of the isolation layer is flush with the first face of the substrate.

11. The semiconductor device according to claim 9, wherein the conducting plug comprises:

a liner located on a surface of the substrate;

a buffer layer located on a surface of the liner;

a third conducting layer located on a surface of the buffer layer, wherein the third conducting layer is electrically connected to the second conducting layer.

12. The semiconductor device according to claim 10, further comprising:

a dielectric layer located on the word line, the isolation layer and the substrate, wherein the first conducting layer and part of the connecting layer are located in the dielectric layer.

13. A method for forming a semiconductor device, comprising:

providing a substrate;

forming a word line in the substrate by taking a first face of the substrate as an upper surface;

forming a connecting layer electrically connected to one end of the word line in part of the substrate and on the substrate;

forming a first conducting layer on the connecting layer; and forming a conducting plug in the substrate by taking a second face of the substrate as an upper surface, wherein the conducting plug is electrically connected to another end of the word line and electrically connected to the first conducting layer via the word line and the connecting layer, and wherein the first face and the second face are two faces of the substrate opposite to each other in a thickness direction of the substrate;

wherein forming the first conducting layer on a surface of the connecting layer comprises:

forming a second dielectric layer on a surface of the first dielectric layer having the connecting layer;

forming a fourth groove penetrating through the second dielectric layer, wherein the fourth groove exposes the connecting layer;

filling the fourth groove to form the first conducting layer, wherein the first conducting layer is electrically connected to the connecting layer.

* * * * *